US008036391B2

(12) United States Patent
Cronin

(10) Patent No.: US 8,036,391 B2
(45) Date of Patent: *Oct. 11, 2011

(54) AUTOMATIC ADJUSTMENTS OF AUDIO ALERT CHARACTERISTICS OF AN ALERT DEVICE USING AMBIENT NOISE LEVELS

(75) Inventor: Thomas Cronin, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 77 days.

This patent is subject to a terminal disclaimer.

(21) Appl. No.: 12/615,633

(22) Filed: Nov. 10, 2009

(65) Prior Publication Data

US 2010/0061560 A1 Mar. 11, 2010

Related U.S. Application Data

(63) Continuation of application No. 11/088,315, filed on Mar. 23, 2005, now Pat. No. 7,636,444, which is a continuation of application No. 10/102,031, filed on Mar. 19, 2002, now abandoned.

(51) Int. Cl.
*H03G 3/20* (2006.01)
*H04M 1/00* (2006.01)
*H04M 3/00* (2006.01)

(52) U.S. Cl. .................. 381/57; 381/107; 379/373.01; 379/375.01

(58) Field of Classification Search .............. 381/57, 381/104–107, 109, 110, 56; 700/94; 379/418, 379/373.01, 375.01
See application file for complete search history.

(56) References Cited

U.S. PATENT DOCUMENTS

| 5,757,937 A | 5/1998 | Itoh et al. |
| 5,844,983 A | 12/1998 | Lilja |
| 5,963,639 A | 10/1999 | Kanamaki |
| 5,991,420 A | 11/1999 | Stern |
| 6,246,761 B1 | 6/2001 | Cuddy |
| 6,360,187 B1 | 3/2002 | Hermann |

FOREIGN PATENT DOCUMENTS

| EP | 0959608 | 11/1999 |
| GB | 2331429 | 5/1999 |
| WO | WO 99/03259 | 1/1999 |
| WO | WO 99/05850 | 2/1999 |

OTHER PUBLICATIONS

European Patent Application No. 03711438.6 Foreign Communication Pursuant to Article 94(3) EPC dated Jun. 1, 2010. Mailing date of Foreign Associate letter Jun. 10, 2010, 7 pages.
Gallagher, Jr., Neil C., "Median Filters: A Tutorial", *ISCAS' 88*, School of Electrical Engineering Purdue University, West Lafayette, IN 47907, (1988), 1737-1744.

*Primary Examiner* — Xu Mei
(74) *Attorney, Agent, or Firm* — Blakely, Sokoloff, Taylor & Zafman LLP

(57) ABSTRACT

The automatic adjustment of audio alert characteristics of an alert device using ambient noise levels is described. In one aspect of the invention, a machine-readable medium has executable instructions to cause a machine to perform a method to receive an audio sample of ambient noise and adjust a characteristic of the audio alert, such as, the volume level of the audio alert, based on the ambient noise level.

18 Claims, 3 Drawing Sheets

AUTOMATIC ADJUSTMENTS OF AUDIO ALERT CHARACTERISTICS OF AN ALERT DEVICE USING AMBIENT NOISE LEVELS

This application is a continuation of U.S. patent application Ser. No. 11/088,315, filed Mar. 23, 2005, now U.S. Pat. No. 7,636,444 entitled "AUTOMATIC ADJUSTMENTS OF AUDIO ALERT CHARACTERISTICS OF AN ALERT DEVICE USING AMBIENT NOISE LEVELS", now allowed, which is a continuation application and claims priority of U.S. application Ser. No. 10/102,031, filed on Mar 19, 2002, now abandoned and priority is claimed thereof.

BACKGROUND OF THE INVENTION

1. Field of the Invention

The invention relates to the field of notification computing. More specifically, the invention relates to the automatic adjustment of an audio alert characteristic of an alert device using ambient noise levels.

2. Background of the Invention

Portable consumer electronic devices allow users to receive information while in remote locations. Many of these devices have the capability to emit an audible alert notifying the user of a happening of an event. For example, a mobile telephone may broadcast a portion of the National Anthem upon receiving an incoming call.

However, the audible alert on most consumer electronic devices may, at times, become an annoyance to others when the volume level of the device is set too loud for particular environments. For example, the incoming call ringer of a mobile phone may annoy third parties and cause embarrassment to the user of the phone in a library, if the volume of the ringer is set to high. The various sounds emulated from many of these portable consumer electronic devices, have infuriated many to a point where patrons are required to turn off or remove these devices before entering particular environments, thereby increasing the likelihood of the user of the device to miss an important message.

In addition, the user of the portable consumer electronic device is frustrated when the volume level of the device is set too low. For example, the user of the mobile phone may forget to increase the volume level of the device after leaving the library thereby increasing the likelihood of missing an important phone call. In this situation, the user is unable to hear the ringing phone because the ambient noise level is louder than the volume level of the ringer of the device.

BRIEF DESCRIPTION OF THE DRAWINGS

The invention may best be understood by referring to the following description and accompanying drawings that are used to illustrate embodiments of the invention. In the drawings.

DETAILED DESCRIPTION OF THE INVENTION

In the following description, numerous specific details are set forth to provide a thorough understanding of the invention. However, it is understood that the invention may be practiced without these specific details. In other instances, well-known circuits, structures and techniques have not been shown in detail in order not to obscure the invention.

The automatic adjustment of audio alert characteristics of an alert device using ambient noise levels is described. An audio alert on an alert device uses one or more audible tones to inform its owner that a certain event or condition has occurred. Examples of an alert device include a pager, a mobile phone, a personal digital assistance (PDA), a portable computer, among other consumer electronics devices. Specifically, the following describes how an alert device collects audio samples of ambient noise levels and adjusts the audio alert characteristics (e.g., volume level) of the alert device. For example, if the ambient noise level is low, such as when the alert device is in a library, the volume level of the alert device is automatically adjusted to a low volume level setting so to not disturb others. Alternatively, if the ambient noise level is high, such as when the alert device is in a construction zone, the volume level of the device is automatically adjusted to a high volume setting to overcome the high ambient noise level and to alert the user of the alert device of an event.

Figure 1:
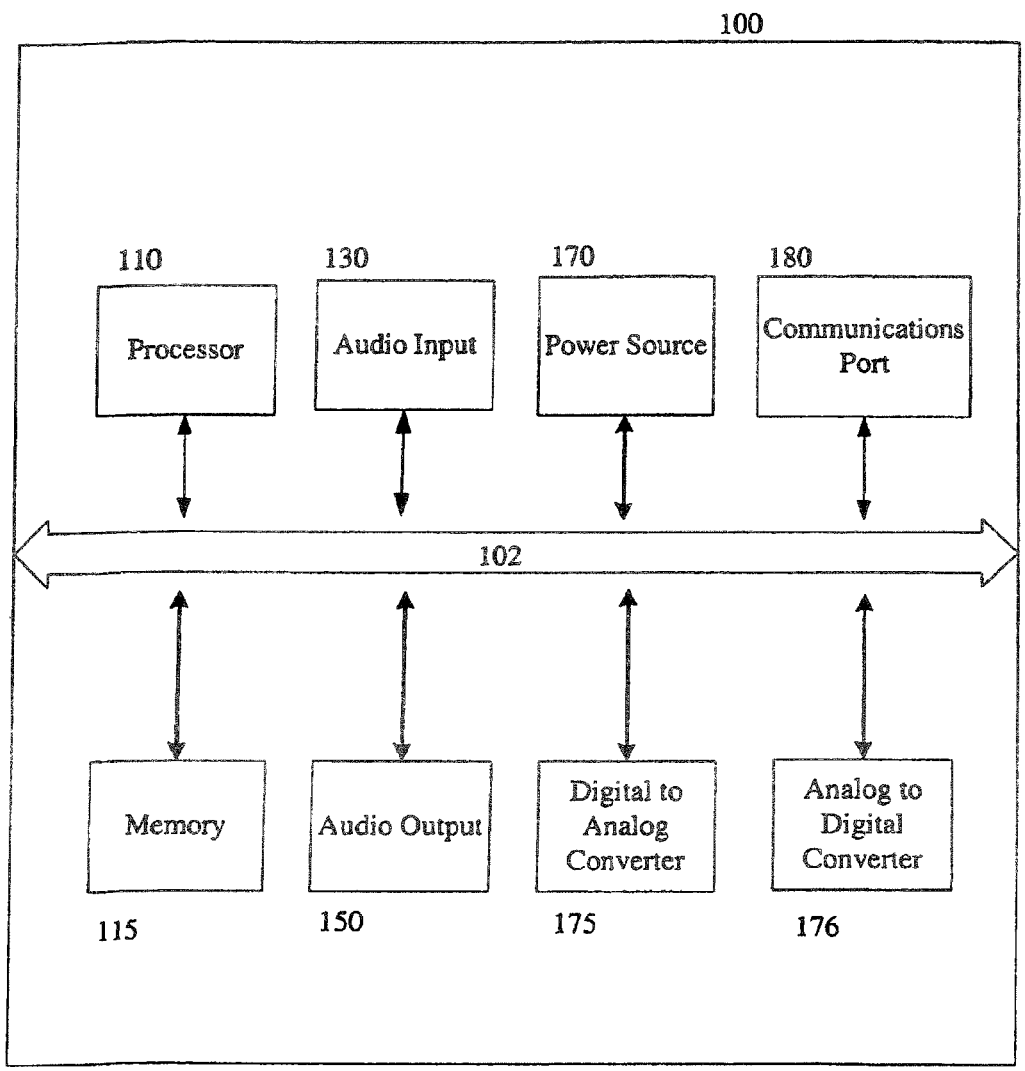
FIG. 1 illustrates the components of a typical alert device according to an embodiment of the invention.

FIG. 1 illustrates the components of a typical alert device 100 according to an embodiment of the invention. The components include a processor 110, a memory 115, an audio input 130, an audio output 150, a power source 170, a digital-to-analog converter 175, an analog-to-digital converter 176, and a communications port 180. In one embodiment, each of the components are embedded on a circuit board and interconnected by a circuit 102.

The processor 110 coordinates all of the processing of the other components of the alert device 100 based on instructions stored in the memory 115, including instructions (e.g., audio alert rules) to adjust the audio alert characteristics of the alert device 100, as will be described.

The audio input 130 changes ambient audio into an electrical audio signal. Examples of an audio input 130 include a microphone. The audio output 150 changes an electrical audio signal into sound. Examples of the audio output 150 include a speaker output, piezoelectric buzzer, or other sound output devices. Typically, the alert device 100 may receive a notification from a local application (e.g., from scheduling software), or a remote notification of an event via the communications port 180. Examples of a communications port 180 on an alert device 100 include a wireless radio frequency port, an infrared port, a telephone port, an Ethernet port, a cable modem port, among other examples. Examples of a notification event include an incoming phone call, a pager alert, a reminder of an appointment on a PDA, an alert of incoming email on a portable computer, among other examples. In one embodiment, the processor 110 receives the notification event from the communication port 180 and instructs the audio output 150 (e.g., speaker) to broadcast a predefined audio alert. For example, a portable computer may broadcast an announcement when a user receives a new incoming email message.

The audio alert on the alert device 100 may have configurable characteristics that allow a user to adjust a specific audible tone or set of audible tones (e.g., music), a volume level, etc. Examples of audio alert characteristics of an audible tone include duration of audible tone, musical key of audible tone, etc. Typically, the adjustable characteristics of an audio alert differs from device to device and the settings for one device may also have different results for each device. For example, the medium volume level on a PDA device might be five (i.e., the user may set the volume level by a spindle controller, a sliding bar, etc.). However, the actual loudness of the medium level may differ from other PDA devices made by another manufacturer or another type of alert device, such as a personal pager set to a medium volume level of five.

The memory 115 may include a static RAM or Flash memory that remains intact when the alert device 100 is shut down. The alert device 100 is powered by the power source 170. Examples of the power source 170 include a rechargeable battery, a disposable battery, etc. At times, the analog-to-digital converter 176 converts the incoming analog audio sample signal of ambient noise to a digital signal before the processor 110 determines which audio alert to broadcast on the audio output 150. The sound of an audio alert is generally stored as a digital audio file in the memory 115. Upon performing any necessary adjustments to the characteristics of the audio alert, the processor 110 may direct the digital audio file to the digital-to-analog converter 175 to be converted to an analog signal that is broadcasted on the audio output 150. It should be understood that in alternative embodiments the audio input 130 and audio output 150 include the capability to convert analog-to-digital and digital-to-analog when necessary.

Figure 2:
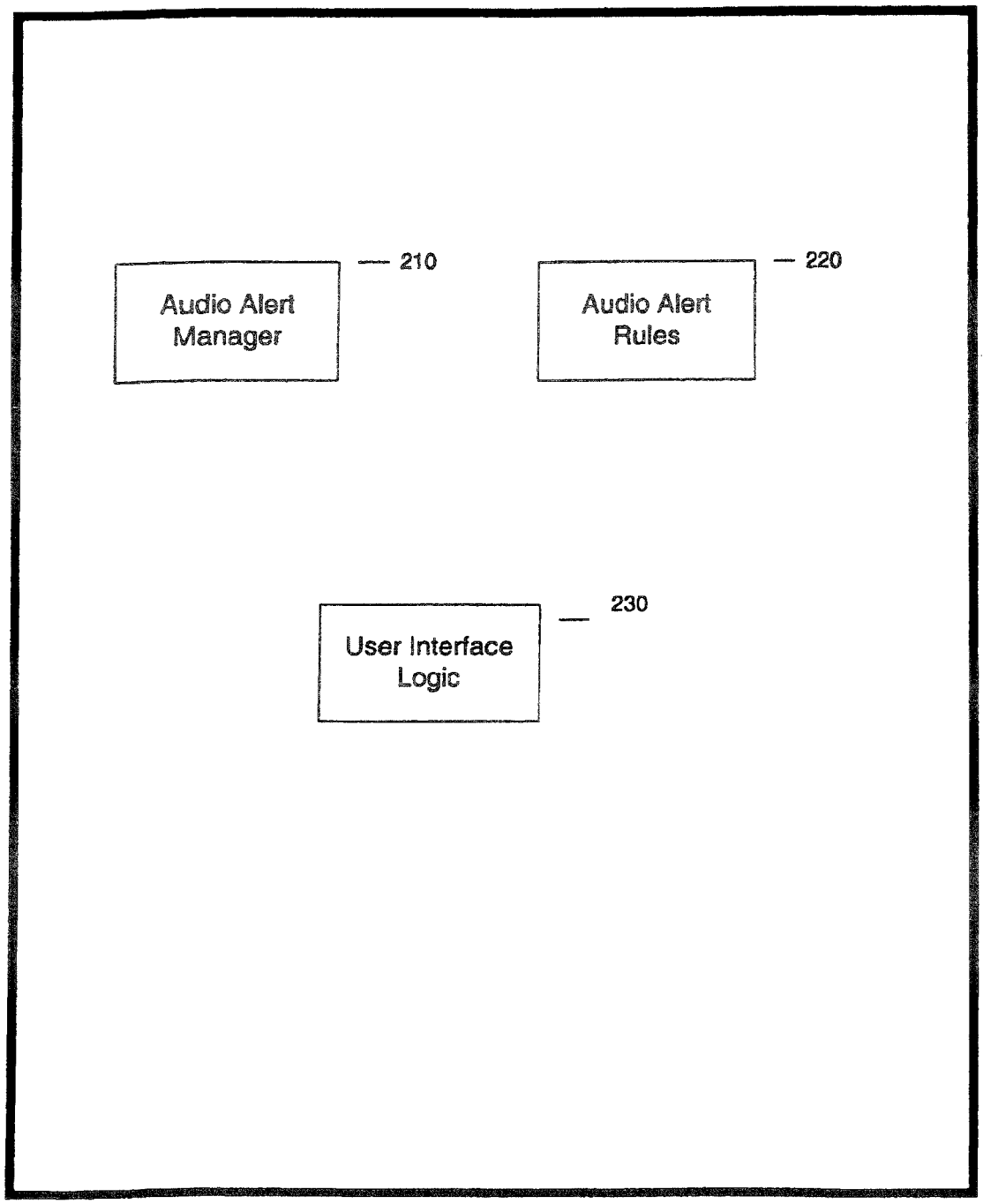
FIG. 2 illustrates an automatic audio alert subsystem according to one embodiment.

FIG. 2 illustrates an automatic audio alert subsystem 200 according to one embodiment. The subsystem 200 includes an audio alert manager 210, audio alert rules 220, and a user interface 230. The audio alert manager 210 includes logic to adjust the characteristics of the audio alert of the alert device 100 based on a given audio sample of the ambient noise. In one embodiment, the audio alert manager 210 includes logic that instructs the processor 110 to select a rule from the audio alert rules 220 based on a given audio sample of the ambient noise to determine whether to adjust the audio alert characteristics of the alert device 100, as will be described.

In one embodiment, the audio sample of the ambient noise obtained by the audio alert manager 210 includes the decibel level of the ambient noise. A decibel is a measurement of sound that may be measured by a sound level meter. On the decibel scale, the smallest audible sound (near total silence) is 0 dB. A sound 10 times more powerful is 10 dB. A sound 100 times more powerful than near total silence is 20 dB. A sound 1,000 times more powerful than near total silence is 30 dB. For example, 15 dB is the decibel level of a whisper, 60 dB is the decibel level of normal conversation, and the decibel level of a rock concert is 120 dB. By obtaining the decibel level of the ambient noise, the audio alert manager 210 may determine the ambient noise level that must be overcome to notify the user of the notification event.

In one embodiment, the audio sample of the ambient noise obtained by the audio alert manager 210 includes the frequency of the ambient noise vibrations. The frequency of sound vibrations is measured in cycles per sound, or Hertz (Hz). A low pitch makes fewer vibrations per second than a high pitch. Therefore, the higher the pitch sounds, the higher the frequency. Human speech, which ranges from 300 to 4,000 Hz, sounds louder to most people than noises at higher or lower frequencies.

The audio alert rules 220 include instructions of how the audio alert manager 210 should adjust the characteristics of the audio alert based on a given audio sample of the ambient noise. In one embodiment, an audio alert rule instructs the adjustment of a characteristic of the audio alert based on the decibel level of the audio sample. For example, the volume level of the audio alert may be configured to be 1.5 times greater than the decibel level of the audio sample. Therefore, if the decibel level of the ambient noise is determined to be 15 dB then the volume level of the audio alert is adjusted to 22.5 dB (e.g., 1.5 times greater than the ambient noise). In this way, the volume level increases incrementally as the ambient noise level increases, yet only enough for the volume of the audio alert to overcome the ambient noise.

In another embodiment, the volume level of the audio alert is adjusted based on a range of the ambient noise level. For example, if the audio sample of the ambient noise has a decibel level within the range of fifteen to forty dB, the volume level of the audio alert is set to a setting of 60 dB in order for the audio alert to be heard but not too loud as to disturb others.

In one embodiment, an audio alert rule instructs the adjustment of a characteristic of the audio alert based on the frequency of the audio sample. For example, the audio alert rule may instruct that when the audio sample has much more low frequency sounds than high frequency, the alert device 100 is assumed to be in a container such as a briefcase or coat pocket, and thus the volume level of the alert device 100 is increased. Here, the user or manufacturer of the alert device 100 may predetermine the increased volume level, to overcome a type of container that the device is frequently enclosed.

In one embodiment, an audio alert rule instructs an adjustment of the frequency of the audible tone of the audio alert, when the frequency of the audible tone of the ambient noise is similar to the frequency of the audible tone of the audio alert. In this way, the broadcast of the audio alert will not blend in with the ambient noise.

In one embodiment, an audio alert rule instructs the adjustment of a characteristic of the audio alert based on a history of audio samples of the ambient noise levels. For example, the audio alert rule may provide instructions to view the history of audio samples stored in the memory 115. The volume level of the audio alert is then based on the median of the ambient audio noise level of the ambient samples taken. Therefore, storing a history of audio samples could avoid the increase of the volume level, based on an inaccurate assessment of the ambient noise levels. For example, a live play may generally be quiet, but have some moments of loud volume that the alert device 100 will be able to determine from the history of audio samples.

In one embodiment, the audio alert rules 220 are stored in the memory 115 and each rule of the audio alert rules 220 may be customizable via the user interface logic 230. For example, a user may customize the audio alert rules 220 on a mobile phone by using a phone keypad and a Liquid Crystal Display (LCD). It should be understood that the invention is not limited to creating audio alert rules based on an ambient noise decibel level and frequency. In alternative embodiments, the user may create audio alert rules based on alternative elements of sound or create a new sound measurement level based on arbitrary sound levels created by the user.

Figure 3:
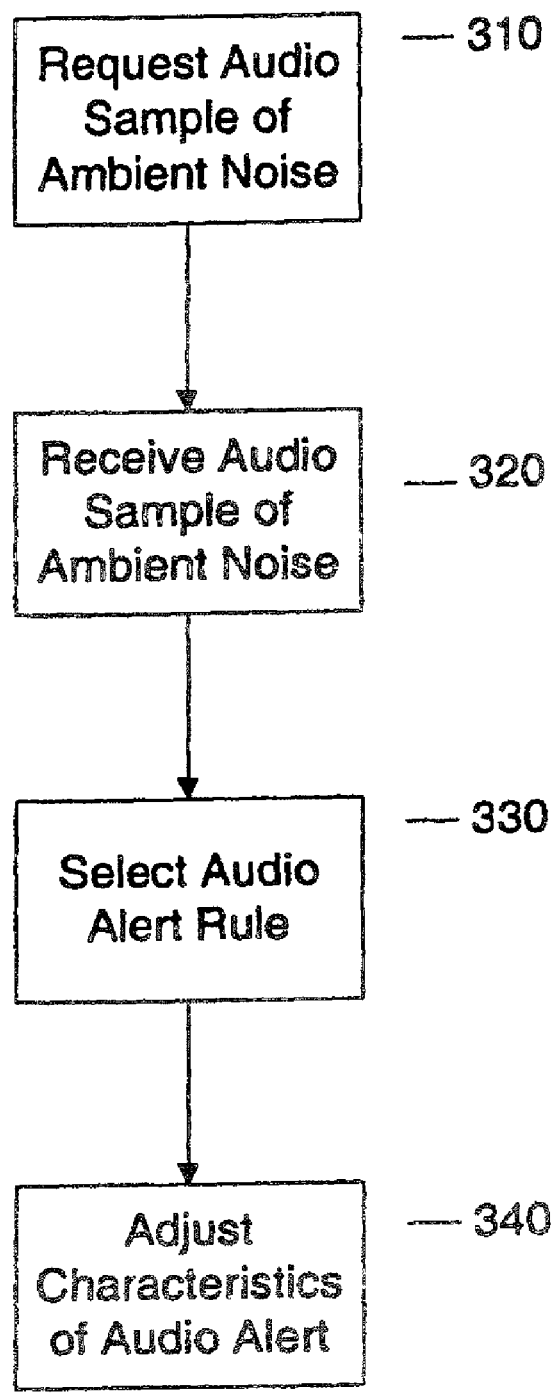
FIG. 3 illustrates a processing flow diagram for adjusting characteristics of an audio alert according to an embodiment of the invention.

FIG. 3 illustrates a processing flow diagram for adjusting characteristics of an audio alert according to an embodiment of the invention. At block 310, the audio alert 210 instructs a microphone to receive an audio sample of the ambient noise. The audio sample may be for a specific duration of time, such as, a half a second (0.5 of a second) to one second (1.0 second). However, it should be understood that the invention is not limited by these audio sample durations. Alternatively, audio samples of less than a half a second or greater than one second may also be used.

In addition, the audio alert manager 210 may direct a microphone to receive the sample of the ambient noise level on a periodic basis, if necessary. For example, the audio alert manager 210 may request an audio sample of the ambient noise levels every 30 seconds. This would be beneficial if the arrival of an alert notification is unpredictable (i.e., a phone call). The number of times to perform the audio sample may be based on the amount of battery life the alert device 100 has, based on predefined time intervals, the interval between when an audio alert is broadcasted and the user acknowledges the audio alert, among other examples. The periodic sampling of audio may also comprise awakening the alert device 100 from a sleep state and placing the alert device back to the sleep state, when necessary.

At block 320, the audio alert manager 210 receives the audio sample of the ambient noise levels. The audio sample may be an analog signal that is processed through an analog-to-digital converter, as described.

At block 330, the audio alert manager 210 selects the appropriate audio alert rule 220 with which the necessary characteristics of the audio alert may be adjusted based on the audio sample of the ambient noise.

At block 340, upon selecting the appropriate audio alert rule 220, the audio alert manager 210 adjusts the necessary characteristics of the audio alert as identified by the selected audio alert rule. The audio alert manager 210 receives the digital audio file of the audio alert from the memory 115, directs conversion of the digital audio file to an analog signal and broadcast the adjusted audio alert. As stated, the selected audio alert rule may instruct the adjustment of the volume level, frequency of the audible tone, and the like as described above.

The description of FIG. 1 is intended to provide an overview of the alert device hardware and other operating components suitable for implementing the invention, but is not intended to limit the applicable environments. It will be appreciated that the alert device 100 is one example of many possible computer system embodiments that have different architectures. A typical computer system will usually include at least a processor, memory, and a bus coupling the memory to the processor. One of ordinary skill in the art will immediately appreciate that the invention can be practiced with various computer system configurations, including a hand held device, a multiprocessor system, various microprocessor based or programmable consumer electronics, a network PC, a minicomputer, a digital signal processing (DSP) processor, and the like. The invention can also be practiced in distributed computing environments where tasks are performed by remote processing devices that are linked through a communications network.

The audio alert rules and methods of the invention may be implemented using computer software. If written in a programming language conforming to a recognized standard, sequences of instructions designed to implement the audio alert rules and methods can be compiled for execution on a variety of hardware platforms or machines and for interface to a variety of operating systems. In addition the present invention is not described with reference to any particular programming language. It will be appreciated that a variety of programming languages may be used to implement the teachings of invention as described herein.

It will be appreciated that more or fewer processes may be incorporated into the method illustrated in FIG. 3 without departing from the scope of the invention and that no particular order is implied by the arrangement of blocks shown and described herein. It further will be appreciated that the method described in conjunction with FIG. 3 may be embodied in machine-executable instructions, e.g. software. The instructions can be used to cause a general-purpose or special-purpose processor that is programmed with the instructions to perform the operations described. Alternatively, the operations might be performed by specific hardware components that contain hardwired logic for performing the operations, or by any combination of programmed computer components and custom hardware components. The method may be provided as a computer program product that may include a machine-readable medium having stored thereon instructions that may be used to program a computer (or other electronic devices) to perform the method. For the purposes of this specification, the terms "machine-readable medium" shall be taken to include any medium that is capable of storing or encoding a sequence of instructions for execution by the machine and that cause the machine to perform any one of the methodologies of the present invention. The term "machine-readable medium" shall accordingly be taken to include, but not be limited to, solid-state memories, optical and magnetic disks, and a carrier wave that encodes a data signal. Furthermore, it is common in the art to speak of software, in one form or another (e.g., program, procedure, process, application, module, logic . . . ), as taking an action or causing a result. Such expressions are merely a shorthand way of saying that execution of the software by a computer causes the processor of the computer to perform an action or a produce a result.

It should be appreciated that the described invention provides for the automatic adjustment of audio alert characteristics on an alert device. The above description disclosed the benefit of lessening the embarrassment of having the volume set too loud while in a quiet environment and also lessen the likelihood of missing a notification event when the volume level of the alert device is too set low to be heard over the ambient noise level. In addition, the invention will allow for the alert device to be heard when it would otherwise be muffled by clothing or the like.

It is understood that the alert device need not be a portable device. The alert device may be for example a desktop PC or set top box that adjust the audio alert characteristic of an audio alert when appropriate, as described above. Also, the alert device need not always adjust the audio alert characteristics upon determining that the current audio alert characteristics are adequate to notify the user of the alert device based on an audio alert rule.

While the invention has been described in terms of several embodiments, those skilled in the art will recognize that the invention is not limited to the embodiments described. The method and apparatus of the invention can be practiced with modification and alteration within the spirit and scope of the appended claims. The description is thus to be regarded as illustrative instead of limiting on the invention.

What is claimed is:

1. A non-transitory machine-readable storage medium comprising instructions that when executed, cause a machine to:
    receive a plurality of audio samples of ambient noise prior to receiving a first notification of an occurrence of an audio alert to be broadcast, wherein receiving includes receiving an analog audio sample of the ambient noise, and converting the analog audio sample to a digital audio sample; and
    adjust a volume level of an audio alert between a first active setting and a second active setting prior to broadcasting the audio alert.

2. The non-transitory machine-readable storage medium of claim 1, wherein the instructions that when executed, further cause the machine to broadcast the adjusted audio alert from an audio output of a computer system.

3. The non-transitory machine-readable storage medium of claim 1, wherein the adjustment is based on a median of a history of the decibel level of the ambient noise stored in a memory.

4. The non-transitory machine-readable storage medium of claim 1, wherein the plurality of audio samples includes a plurality of decibel levels of ambient noise or a plurality of frequencies of ambient noise.

5. The non-transitory machine-readable storage medium of claim 4, wherein the instructions that when executed, further cause the machine to:
  determine a median decibel level based on the plurality of decibel levels, wherein the adjusted volume level of the audio alert is greater than the median decibel level of the plurality of decibel levels.

6. The non-transitory machine-readable storage medium of claim 4, wherein the instructions that when executed, further cause the machine to:
  determine a median frequency level based on the plurality of frequencies, wherein an adjusted frequency of the audio alert differs from the median frequency level of the plurality of frequencies.

7. An apparatus comprising:
  an audio input to receive a plurality of audio samples of ambient noise prior to receiving a first notification of an occurrence of an audio alert to be broadcast, wherein receiving includes receiving an analog audio sample of the ambient noise, and converting the analog audio sample to a digital audio sample;
  a processor to adjust a volume level of an audio alert between a first active setting and a second active setting prior to broadcasting the audio alert, wherein the adjustment is based on a median of a history of the decibel level of the ambient noise stored in a memory; and
  a circuit coupling the audio input and the processor.

8. The apparatus of claim 7, further comprising an audio output to broadcast the adjusted audio alert.

9. The apparatus of claim 7, wherein the plurality of audio samples include a decibel level of ambient noise or a plurality of frequencies of ambient noise.

10. The apparatus of claim 7, wherein each audio sample comprises an audible tone of ambient noise, an adjusted audible tone of the audio sample to differ from the audible tone of ambient noise.

11. A computerized method comprising:
  receiving, via an audio input, an audio sample of ambient noise at a computer system to determine a decibel level of the ambient noise prior to receiving a first notification of an occurrence of an audio alert to be broadcast, wherein receiving includes receiving an analog audio sample of the ambient noise, and converting the analog audio sample to a digital audio sample; and
  adjusting, via a processor, a volume level of an audio alert between a first active setting and a second active setting prior to broadcasting the audio alert, wherein the processor is coupled to the audio input via a circuit.

12. The computerized method of claim 11, further comprising broadcasting the adjusted audio alert from an audio output of the computer system, wherein the adjusted volume level of the audio alert is greater than the decibel level of the ambient noise..

13. The computerized method of claim 11, wherein the adjustment is based on a median of a history of the decibel level of the ambient noise stored in a memory.

14. The computerized method of claim 11, further comprising:
  receiving a plurality of audio samples of ambient noise prior to an occurrence of an event, each audio sample of the plurality of audio samples to include a decibel level of ambient noise.

15. The computerized method of claim 11, further comprising:
  determining a median decibel level based on the decibel level of each audio sample of the plurality of audio samples.

16. The computerized method of claim 11, wherein the adjustment of the characteristic is performed after the occurrence of the event based on the received audio sample of ambient noise and the median decibel level.

17. A system comprising:
  an alert device having a plurality of components embedded on a circuit board, the plurality of components including:
    an audio input to receive a plurality of audio samples of ambient noise prior to receiving a first notification of an occurrence of an audio alert to be broadcast, wherein receiving includes receiving an analog audio sample of the ambient noise, and converting the analog audio sample to a digital audio sample;
    a processor to adjust a volume level of an audio alert between a first active setting and a second active setting prior to broadcasting the audio alert, wherein the adjustment is based on a median of a history of the decibel level of the ambient noise stored in a memory; and
    a circuit coupling the audio input and the processor.

18. The system of claim 17, further comprising an audio output to broadcast the adjusted audio alert.

* * * * *